(12) United States Patent
Ricart et al.

(10) Patent No.: US 11,323,114 B2
(45) Date of Patent: May 3, 2022

(54) ELECTRICAL SYSTEM

(71) Applicant: Lear Corporation, Southfield, MI (US)

(72) Inventors: Raúl Ricart, Valls (ES); Antoni Ferré Fàbregas, Valls (ES)

(73) Assignee: Lear Corporation, Southfield, MI (US)

(*) Notice: Subject to any disclaimer, the term of this patent is extended or adjusted under 35 U.S.C. 154(b) by 0 days.

(21) Appl. No.: 17/060,566

(22) Filed: Oct. 1, 2020

(65) Prior Publication Data
US 2021/0105011 A1    Apr. 8, 2021

Related U.S. Application Data

(60) Provisional application No. 62/910,652, filed on Oct. 4, 2019.

(51) Int. Cl.
| H03K 17/687 | (2006.01) |
| H03K 17/30 | (2006.01) |
| H03K 19/0944 | (2006.01) |
| B60R 21/01 | (2006.01) |

(52) U.S. Cl.
CPC ........... H03K 17/687 (2013.01); B60R 21/01 (2013.01); H03K 17/302 (2013.01); H03K 19/0944 (2013.01)

(58) Field of Classification Search
CPC .............. H03K 17/687; H03K 17/302; H03K 19/0944; B60R 21/01; B60N 2002/0272
USPC .......................................................... 701/49
See application file for complete search history.

(56) References Cited

U.S. PATENT DOCUMENTS

| 2,126,143 A | 8/1938 | McGregor |
| 2,263,554 A | 11/1941 | Brach |
| 2,480,622 A | 8/1949 | Warnock |
| 2,678,082 A | 5/1954 | Nathan |
| 3,181,102 A | 4/1965 | Fehr |

(Continued)

FOREIGN PATENT DOCUMENTS

| CN | 203190203 U | 9/2013 |
| CN | 203799201 U | 8/2014 |

(Continued)

OTHER PUBLICATIONS

Co-Pending U.S. Appl. No. 16/597,187, filed Oct. 9, 2019.

(Continued)

*Primary Examiner* — Tomi Skibinski
(74) *Attorney, Agent, or Firm* — Fishman Stewart PLLC

(57) ABSTRACT

An electrical system may include a mounting surface, a component configured for connection with the mounting surface and configured to move relative to the mounting surface, and/or an orientation sensor configured to determining an orientation of the component relative to the mounting surface. The orientation sensor may include a first sensor (e.g., a magnetometer, an accelerometer, a gyroscope, etc.) connected, at least indirectly, to the mounting surface, and a second sensor (e.g., a magnetometer, an accelerometer, a gyroscope, etc.) connected to move with the component. The orientation sensor may include an electronic controller. The electronic controller may be configured to compare first information from the first sensor to second information from the second sensor to determine the orientation of the component relative to the mounting surface.

20 Claims, 11 Drawing Sheets

(56) References Cited

U.S. PATENT DOCUMENTS

| | | |
|---|---|---|
| 3,213,403 A | 10/1965 | Hermann |
| 3,268,848 A | 8/1966 | Adams |
| 3,603,918 A | 9/1971 | Woertz |
| 3,933,403 A | 1/1976 | Rubesamen et al. |
| 3,940,182 A | 2/1976 | Tamura |
| 4,020,769 A | 5/1977 | Keir |
| 4,198,025 A | 4/1980 | Lowe et al. |
| 4,243,248 A | 1/1981 | Scholz et al. |
| 4,282,631 A | 8/1981 | Uehara et al. |
| 4,511,187 A | 4/1985 | Rees |
| 4,575,295 A | 3/1986 | Rebentisch |
| 4,618,808 A | 10/1986 | Ish-Shalom et al. |
| 4,707,030 A | 11/1987 | Harding |
| 4,711,589 A | 12/1987 | Goodbred |
| 4,763,360 A | 8/1988 | Daniels et al. |
| 4,776,809 A | 10/1988 | Hall |
| 4,830,531 A | 5/1989 | Condit et al. |
| 4,853,555 A | 8/1989 | Wheat |
| 4,961,559 A | 10/1990 | Raymor |
| 4,969,621 A | 11/1990 | Munchow et al. |
| 4,987,316 A | 1/1991 | White et al. |
| 5,106,144 A | 4/1992 | Hayakawa et al. |
| 5,137,331 A | 8/1992 | Colozza |
| 5,167,393 A | 12/1992 | Hayakawa et al. |
| 5,192,045 A | 3/1993 | Yamada et al. |
| 5,222,814 A | 6/1993 | Boelryk |
| 5,302,065 A | 4/1994 | Vogg et al. |
| 5,322,982 A | 6/1994 | Leger et al. |
| 5,332,290 A | 7/1994 | Borlinghaus et al. |
| 5,348,373 A | 9/1994 | Stiennon |
| 5,362,241 A | 11/1994 | Matsuoka et al. |
| 5,446,442 A | 8/1995 | Swart et al. |
| 5,466,892 A | 11/1995 | Howard et al. |
| 5,489,173 A | 2/1996 | Hofle |
| 5,582,381 A | 12/1996 | Graf et al. |
| 5,599,086 A | 2/1997 | Dutta |
| 5,618,192 A | 4/1997 | Drury |
| 5,655,816 A | 8/1997 | Magnuson et al. |
| 5,676,341 A | 10/1997 | Tarusawa et al. |
| 5,696,409 A | 12/1997 | Handman et al. |
| 5,701,037 A | 12/1997 | Weber et al. |
| 5,796,177 A | 8/1998 | Werbelow et al. |
| 5,800,015 A | 9/1998 | Tsuchiya et al. |
| 5,899,532 A | 5/1999 | Paisley et al. |
| 5,918,847 A | 7/1999 | Couasnon |
| 5,921,606 A | 7/1999 | Moradell et al. |
| 5,964,442 A | 10/1999 | Wingblad et al. |
| 5,964,815 A | 10/1999 | Wallace et al. |
| 6,008,547 A | 12/1999 | Dobler et al. |
| 6,036,157 A | 3/2000 | Baroin et al. |
| 6,081,044 A | 6/2000 | Anthofer et al. |
| 6,142,718 A | 11/2000 | Kroll |
| 6,150,774 A | 11/2000 | Mueller et al. |
| 6,166,451 A | 12/2000 | Pigott |
| 6,216,995 B1 | 4/2001 | Koester |
| 6,227,595 B1 | 5/2001 | Hamelin et al. |
| 6,290,516 B1 | 9/2001 | Gerber |
| 6,296,498 B1 | 10/2001 | Ross |
| 6,299,230 B1 | 10/2001 | Oettl |
| 6,318,802 B1 | 11/2001 | Sjostrom et al. |
| 6,325,645 B1 | 12/2001 | Schuite |
| 6,357,814 B1 | 3/2002 | Boisset et al. |
| 6,400,259 B1 | 6/2002 | Bourcart et al. |
| 6,405,988 B1 | 6/2002 | Taylor et al. |
| 6,422,596 B1 | 7/2002 | Fendt et al. |
| 6,439,531 B1 | 8/2002 | Severini et al. |
| 6,480,144 B1 | 11/2002 | Miller et al. |
| 6,565,119 B2 | 5/2003 | Fogle, Jr. |
| 6,566,765 B1 | 5/2003 | Nitschke et al. |
| 6,588,722 B2 | 7/2003 | Eguchi et al. |
| 6,693,368 B2 | 2/2004 | Schumann et al. |
| 6,710,470 B2 | 3/2004 | Bauer et al. |
| 6,719,350 B2 | 4/2004 | Duchateau et al. |
| 6,736,458 B2 | 5/2004 | Chabanne et al. |
| 6,772,056 B2 | 8/2004 | Mattes et al. |
| 6,805,375 B2 | 10/2004 | Enders et al. |
| 6,851,708 B2 | 2/2005 | Kazmierczak |
| 6,869,057 B2 | 3/2005 | Matsumoto et al. |
| 6,882,162 B2 | 4/2005 | Schirmer et al. |
| 6,960,993 B2 | 11/2005 | Mattes et al. |
| 7,042,342 B2 | 5/2006 | Luo et al. |
| 7,083,437 B2 | 8/2006 | Mackness |
| 7,086,874 B2 | 8/2006 | Mitchell et al. |
| 7,113,541 B1 | 9/2006 | Lys et al. |
| 7,159,899 B2 | 1/2007 | Nitschke et al. |
| 7,170,192 B2 | 1/2007 | Kazmierczak |
| 7,188,805 B2 | 3/2007 | Henley et al. |
| 7,207,541 B2 | 4/2007 | Frohnhaus et al. |
| 7,271,501 B2 | 9/2007 | Dukart et al. |
| 7,288,009 B2 | 10/2007 | Lawrence et al. |
| 7,293,831 B2 | 11/2007 | Greene |
| 7,300,091 B2 | 11/2007 | Nihonmatsu et al. |
| 7,322,605 B2 | 1/2008 | Ventura et al. |
| 7,348,687 B2 | 3/2008 | Aichriedler et al. |
| 7,363,194 B2 | 4/2008 | Schlick et al. |
| 7,370,831 B2 | 5/2008 | Laib et al. |
| 7,388,466 B2 | 6/2008 | Ghabra et al. |
| 7,389,960 B2 | 6/2008 | Mitchell et al. |
| 7,416,042 B2 | 8/2008 | Czaykowska et al. |
| 7,434,883 B2 | 10/2008 | Deptolla |
| 7,454,170 B2 | 11/2008 | Goossens et al. |
| 7,455,535 B2 | 11/2008 | Insalaco et al. |
| 7,503,522 B2 | 3/2009 | Henley et al. |
| 7,505,754 B2 | 3/2009 | Kazmierczak et al. |
| 7,523,913 B2 | 4/2009 | Mizuno et al. |
| 7,556,233 B2 | 7/2009 | Gryp et al. |
| 7,560,827 B2 | 7/2009 | Jacas-Miret et al. |
| 7,633,301 B2 | 12/2009 | Steenwyk et al. |
| 7,661,637 B2 | 2/2010 | Mejuhas et al. |
| 7,665,939 B1 | 2/2010 | Cardona |
| 7,739,820 B2 | 6/2010 | Frank |
| 7,744,386 B1 | 6/2010 | Speidel et al. |
| 7,980,525 B2 | 7/2011 | Kostin |
| 7,980,798 B1 | 7/2011 | Kuehn et al. |
| 8,010,255 B2 | 8/2011 | Darraba |
| 8,146,991 B2 | 4/2012 | Stanz et al. |
| 8,278,840 B2 | 10/2012 | Logiudice et al. |
| 8,282,326 B2 | 10/2012 | Krostue et al. |
| 8,376,675 B2 | 2/2013 | Schulze et al. |
| 8,463,501 B2 | 6/2013 | Jousse |
| 8,536,928 B1 | 9/2013 | Gagne et al. |
| 8,648,613 B2 | 2/2014 | Ewerhart et al. |
| 8,702,170 B2 | 4/2014 | Abraham et al. |
| 8,757,720 B2 | 6/2014 | Hurst, III et al. |
| 8,800,949 B2 | 8/2014 | Schebaum et al. |
| 8,857,778 B2 | 10/2014 | Nonomiya |
| 8,936,526 B2 | 1/2015 | Boutouil et al. |
| 8,967,719 B2 | 3/2015 | Ngiau et al. |
| RE45,456 E | 4/2015 | Sinclair et al. |
| 9,010,712 B2 | 4/2015 | Gray et al. |
| 9,018,869 B2 | 4/2015 | Yuasa et al. |
| 9,045,061 B2 | 6/2015 | Kostin et al. |
| 9,162,590 B2 | 10/2015 | Nagura et al. |
| 9,174,604 B2 | 11/2015 | Wellhoefer et al. |
| 9,242,580 B2 | 1/2016 | Schebaum et al. |
| 9,318,922 B2 | 4/2016 | Hall et al. |
| 9,340,125 B2 | 5/2016 | Stutika et al. |
| 9,346,428 B2 | 5/2016 | Bortolin |
| 9,422,058 B2 | 8/2016 | Fischer et al. |
| 9,561,770 B2 | 2/2017 | Sievers et al. |
| 9,608,392 B1 | 3/2017 | Destro |
| 9,610,862 B2 | 4/2017 | Bonk et al. |
| 9,663,232 B1 | 5/2017 | Porter et al. |
| 9,673,583 B2 | 6/2017 | Hudson et al. |
| 9,701,217 B2 | 7/2017 | Eckenroth et al. |
| 9,731,628 B1 | 8/2017 | Rao et al. |
| 9,758,061 B2 | 9/2017 | Pluta et al. |
| 9,789,834 B2 | 10/2017 | Rapp et al. |
| 9,796,304 B2 | 10/2017 | Salter et al. |
| 9,815,425 B2 | 11/2017 | Rao et al. |
| 9,821,681 B2 | 11/2017 | Rao et al. |
| 9,840,220 B2 | 12/2017 | Van Buskirk et al. |
| 9,919,624 B2 | 3/2018 | Cziomer et al. |
| 9,950,682 B1 | 4/2018 | Gramenos et al. |

(56) References Cited

U.S. PATENT DOCUMENTS

| | | |
|---|---|---|
| 10,059,232 B2 | 8/2018 | Frye et al. |
| 10,160,351 B2 | 12/2018 | Sugimoto et al. |
| 10,479,227 B2 | 11/2019 | Nolte et al. |
| 10,493,243 B1 | 12/2019 | Braham |
| 10,547,135 B2 | 1/2020 | Sugiura |
| 10,549,659 B2 | 2/2020 | Sullivan et al. |
| 10,654,378 B2 | 5/2020 | Pons |
| 2005/0046367 A1 | 3/2005 | Wevers et al. |
| 2005/0089367 A1 | 4/2005 | Sempliner |
| 2005/0150705 A1 | 7/2005 | Vincent et al. |
| 2005/0211835 A1 | 9/2005 | Henley et al. |
| 2005/0215098 A1 | 9/2005 | Muramatsu et al. |
| 2005/0230543 A1 | 10/2005 | Laib et al. |
| 2005/0236899 A1 | 10/2005 | Kazmierczak |
| 2005/0258676 A1 | 11/2005 | Mitchell et al. |
| 2006/0131470 A1 | 6/2006 | Yamada et al. |
| 2006/0208549 A1 | 9/2006 | Hancock et al. |
| 2006/0220411 A1 | 10/2006 | Pathak et al. |
| 2008/0021602 A1 | 1/2008 | Kingham et al. |
| 2008/0084085 A1 | 4/2008 | Mizuno et al. |
| 2008/0090432 A1 | 4/2008 | Patterson et al. |
| 2009/0014584 A1 | 1/2009 | Rudduck et al. |
| 2009/0129105 A1 | 5/2009 | Kusu et al. |
| 2009/0251920 A1 | 10/2009 | Kino et al. |
| 2009/0259369 A1* | 10/2009 | Saban ............... B60R 21/01556 701/45 |
| 2009/0302665 A1 | 12/2009 | Dowty |
| 2009/0319212 A1 | 12/2009 | Cech et al. |
| 2010/0117275 A1 | 5/2010 | Nakamura |
| 2011/0024595 A1 | 2/2011 | Oi et al. |
| 2011/0225773 A1 | 9/2011 | Hearn et al. |
| 2012/0112032 A1 | 5/2012 | Kohen |
| 2013/0020459 A1 | 1/2013 | Moriyama et al. |
| 2013/0035994 A1 | 2/2013 | Pattan et al. |
| 2013/0153735 A1 | 6/2013 | Ruthman et al. |
| 2014/0110554 A1 | 4/2014 | Oya et al. |
| 2014/0263920 A1 | 9/2014 | Anticuar et al. |
| 2014/0265479 A1 | 9/2014 | Bennett |
| 2015/0048206 A1 | 2/2015 | Deloubes |
| 2015/0069807 A1 | 3/2015 | Kienke |
| 2015/0083882 A1 | 3/2015 | Stutika et al. |
| 2015/0191106 A1 | 7/2015 | Inoue et al. |
| 2015/0236462 A1 | 8/2015 | Davidson, Jr. et al. |
| 2016/0039314 A1 | 2/2016 | Anticuar et al. |
| 2016/0154170 A1 | 6/2016 | Thompson et al. |
| 2016/0236613 A1 | 8/2016 | Trier |
| 2017/0080825 A1 | 3/2017 | Bonk et al. |
| 2017/0080826 A1 | 3/2017 | Bonk et al. |
| 2017/0166093 A1 | 6/2017 | Cziomer et al. |
| 2017/0261343 A1 | 9/2017 | Lanter et al. |
| 2017/0291507 A1 | 10/2017 | Hattori et al. |
| 2018/0017189 A1 | 1/2018 | Wegner |
| 2018/0039917 A1 | 2/2018 | Buttolo et al. |
| 2018/0072188 A1 | 3/2018 | Yamada |
| 2018/0086232 A1 | 3/2018 | Kume |
| 2018/0105072 A1 | 4/2018 | Pons |
| 2018/0148011 A1 | 5/2018 | Zaugg et al. |
| 2018/0154799 A1 | 6/2018 | Lota |
| 2018/0183623 A1 | 6/2018 | Schoenfeld et al. |
| 2018/0244175 A1 | 8/2018 | Tan |
| 2018/0275648 A1 | 9/2018 | Ramalingam |
| 2019/0001846 A1 | 1/2019 | Jackson et al. |
| 2019/0084453 A1 | 3/2019 | Petit et al. |
| 2019/0126786 A1 | 5/2019 | Dry et al. |
| 2019/0337413 A1 | 11/2019 | Romer |
| 2019/0337414 A1 | 11/2019 | Condamin et al. |
| 2019/0337415 A1 | 11/2019 | Condamin et al. |
| 2019/0337416 A1 | 11/2019 | Condamin et al. |
| 2019/0337417 A1 | 11/2019 | Condamin et al. |
| 2019/0337418 A1 | 11/2019 | Condamin et al. |
| 2019/0337419 A1 | 11/2019 | Condamin et al. |
| 2019/0337420 A1 | 11/2019 | Condamin et al. |
| 2019/0337421 A1 | 11/2019 | Condamin et al. |
| 2019/0337422 A1 | 11/2019 | Condamin et al. |
| 2019/0337471 A1 | 11/2019 | Brehm |
| 2019/0379187 A1 | 12/2019 | Christensen et al. |
| 2019/0389336 A1 | 12/2019 | Malinowski et al. |
| 2020/0009995 A1 | 1/2020 | Sonar |
| 2020/0047641 A1 | 2/2020 | D'Eramo et al. |
| 2020/0055423 A1 | 2/2020 | Prozzi et al. |
| 2020/0079244 A1 | 3/2020 | Carbone et al. |
| 2020/0180516 A1 | 6/2020 | Moulin |
| 2020/0180517 A1 | 6/2020 | Moulin |
| 2020/0189504 A1 | 6/2020 | Ricart et al. |
| 2020/0189511 A1 | 6/2020 | Ricart et al. |
| 2020/0194936 A1 | 6/2020 | Ricart et al. |
| 2020/0194948 A1 | 6/2020 | Lammers et al. |
| 2020/0207241 A1 | 7/2020 | Moulin et al. |
| 2020/0247275 A1 | 8/2020 | Yetukuri et al. |
| 2020/0262367 A1 | 8/2020 | Fernandez Banares et al. |
| 2020/0269754 A1 | 8/2020 | Ricart et al. |
| 2020/0282871 A1 | 9/2020 | Ricart et al. |
| 2020/0282880 A1 | 9/2020 | Jones et al. |

FOREIGN PATENT DOCUMENTS

| | | |
|---|---|---|
| DE | 202005013714 U1 | 12/2005 |
| DE | 102005007430 A1 | 3/2006 |
| DE | 102006022032 A1 | 12/2006 |
| DE | 102010017038 A1 | 2/2011 |
| DE | 102011056278 A1 | 2/2013 |
| DE | 202014102336 U1 | 6/2014 |
| DE | 102015212100 A1 | 12/2015 |
| DE | 102016113409 A1 | 4/2017 |
| EP | 0783990 A1 | 7/1997 |
| EP | 1176047 A1 | 1/2002 |
| EP | 2298609 B1 | 3/2011 |
| EP | 3150426 A1 | 4/2017 |
| FR | 2762814 A1 | 11/1998 |
| FR | 2951329 A1 | 4/2011 |
| FR | 2986751 A1 | 8/2013 |
| JP | 3314591 B2 | 8/2002 |
| JP | 2003227703 A | 8/2003 |
| JP | 2005119518 A | 5/2005 |
| JP | 2007112174 A | 5/2007 |
| JP | 2008158578 A | 7/2008 |
| JP | 4222262 B2 | 2/2009 |
| JP | 2013230721 A | 11/2013 |
| WO | 01/87665 A1 | 11/2001 |
| WO | 2003002256 A2 | 1/2003 |
| WO | 2005068247 A2 | 7/2005 |

OTHER PUBLICATIONS

Co-Pending U.S. Appl. No. 16/672,989, filed Nov. 4, 2019.
Co-Pending U.S. Appl. No. 16/711,661, filed Dec. 12, 2019.
Co-Pending U.S. Appl. No. 17/060,635, filed Oct. 1, 2020.
Co-Pending U.S. Appl. No. 17/060,985, filed Oct. 1, 2020.

* cited by examiner

ELECTRICAL SYSTEM

CROSS-REFERENCE TO RELATED APPLICATION

This application claims the benefit of U.S. Provisional Patent Application Ser. No. 62/910,652, filed on Oct. 4, 2019, the disclosure of which is hereby incorporated by reference in its entirety as though fully set forth herein.

TECHNICAL FIELD

The present disclosure generally relates to electrical systems, including electrical systems that may, for example, be used in connection with vehicles, such as with vehicle seats, tracks, and/or removable components in a vehicle.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical systems may not be configured to determine the orientation of components in the system, such as relative to one or more track assemblies of the system.

There is a desire for solutions/options that minimize or eliminate one or more challenges or shortcomings of electrical systems. The foregoing discussion is intended only to illustrate examples of the present field and is not a disavowal of scope.

SUMMARY

In embodiments, an electrical system may include a component configured for selective connection with, movement (e.g., sliding) relative to, and removal from a mounting surface, and/or an orientation sensor configured to determine an orientation (e.g., angle, direction, etc.) of the component relative to said mounting surface.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
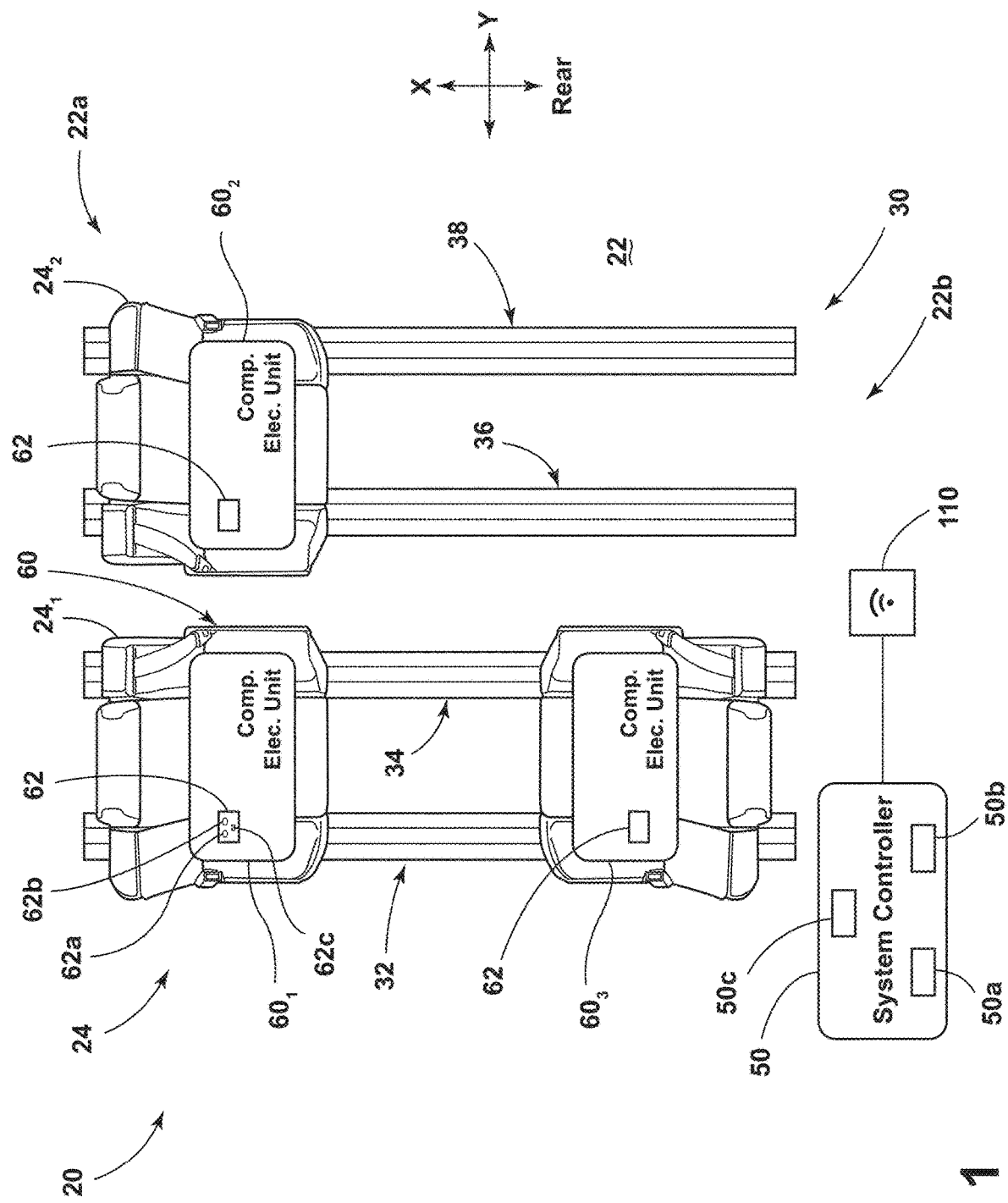
FIG. 1 is a top view generally illustrating an embodiment of an electrical system according to teachings of the present disclosure.
Figure 2:
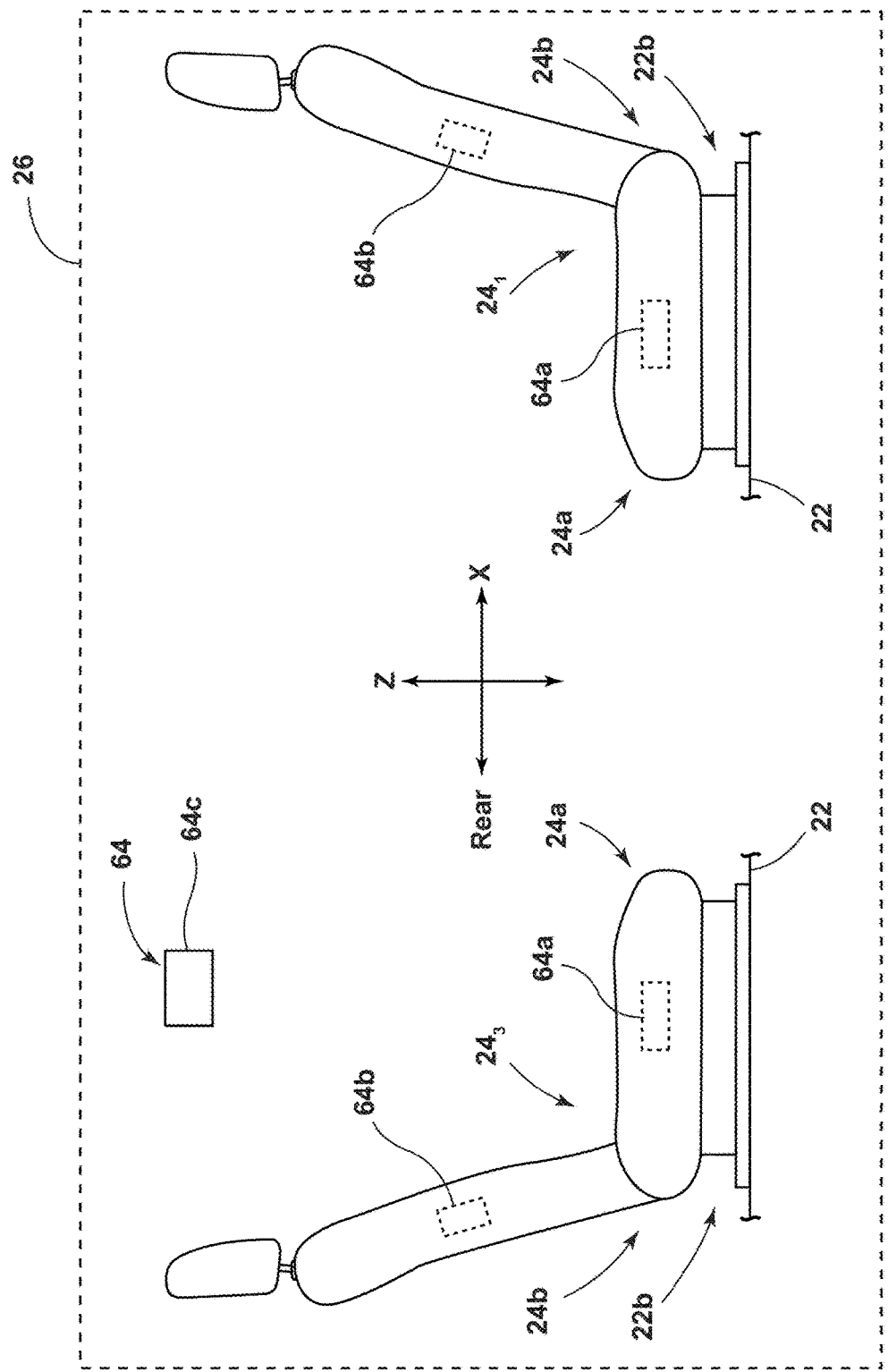
FIG. 2 is a side view generally illustrating an embodiment of an electrical system according to teachings of the present disclosure.

In embodiments, such as generally illustrated in FIGS. 1 and 2, an electrical system 20 may include a mounting surface 22 and one or more components 24 (e.g., a first component 241, a second component 242, and/or a third component 243, or more of fewer components) that may be selectively connected to the mounting surface 22. The mounting surface 22 may, for example and without limitation, include one or more portions/surfaces of a vehicle 26, such as a floor and/or an interior surface of a vehicle 26. The components 24 may, for example and without limitation, include and/or be connected to seats (e.g., vehicle seats), consoles, tables, and/or other components. The components 24 may be selectively removable from the mounting surface 22, may be reconfigurable, and/or may be connected to the mounting surface 22 in a plurality of orientations (e.g., the electrical system 20 may be configured as a removable component system).

In embodiments, an electrical system 20 may include a track/rail assembly 30 that may include a first track/rail 32, a second track/rail 34, a third track/rail 36, and/or a fourth track/rail 38 (or more or fewer tracks/rails), which may be extend substantially in parallel with each other (e.g., in an X-direction) and/or may be offset from each other, such as in a lateral direction (e.g., a Y-direction). The track assembly 30 may be substantially fixed to the mounting surface 22. The one or more components 24 may, with some embodiments, be selectively/releasably connected to (e.g., mechanically and/or electrically), move (e.g., slide) along and relative to, and/or be removed from the mounting surface 22 via the track assembly 30, such as without additional or external tools (e.g., may be selectively secured to and removed from the track assembly 30 in a plurality of positions/orientations along the track assembly 30).

Figure 2A:
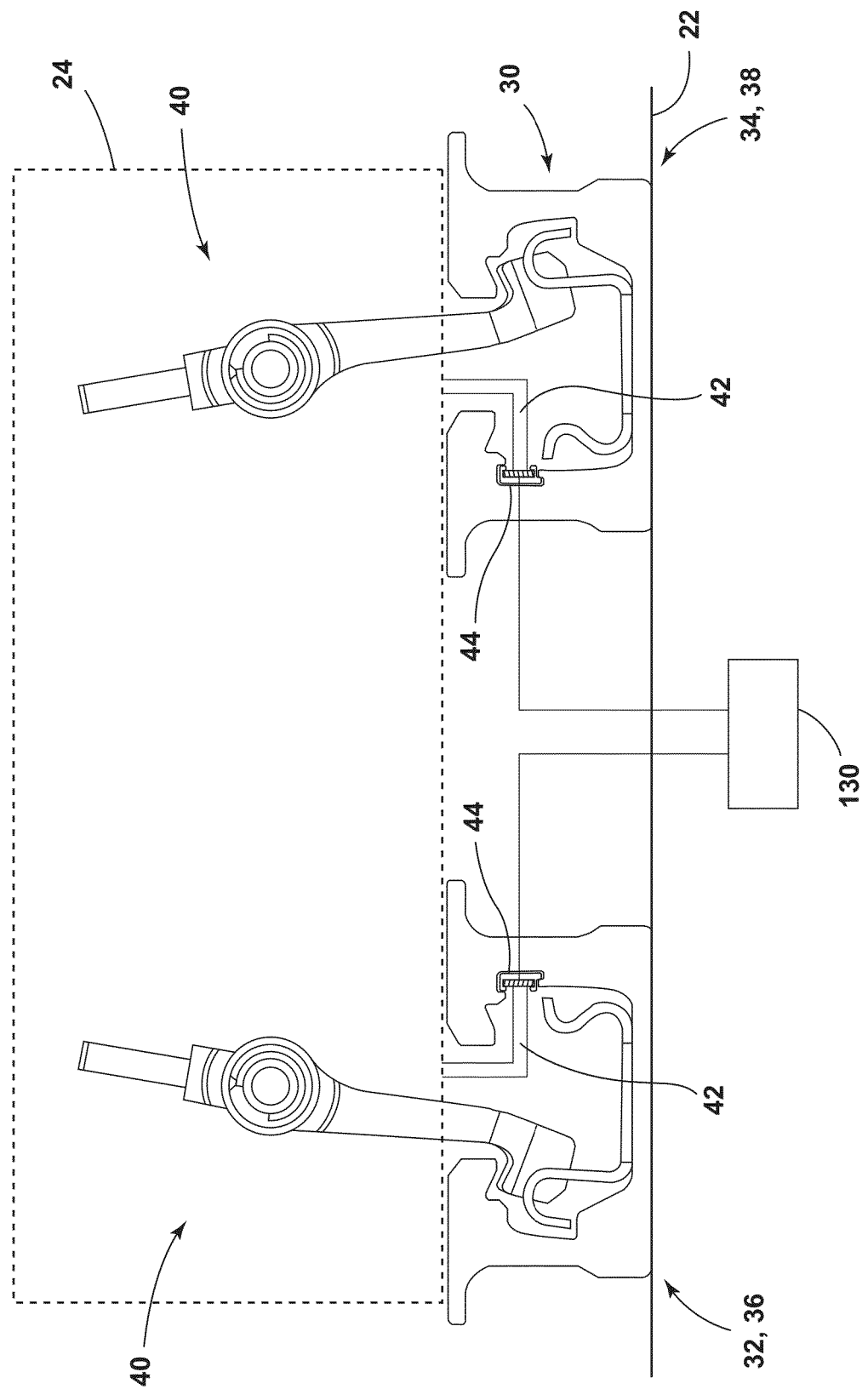
FIG. 2A is an end view generally illustrating an embodiment of a track assembly of an electrical system according to teachings of the present disclosure.

With embodiments, a component 24 may, for example and without limitation, include one or more latches/anchors 40 that may be configured to selectively engage and/or contact the track assembly 30 to restrict or prevent movement of a component 24 in one or more directions (e.g., an X-direction and/or a Z-direction of the track assembly 30), and/or one or more electrical contacts 42 that may be configured to selectively contact a conductor 44 of a track assembly 30, such as to provide power from a power source 130 (e.g., a vehicle battery) to the component 24 (see, e.g., FIG. 2A). The one or more latches/anchors 40 and/or the one or more electrical contacts 42 may be actuated (e.g, rotated) between engaged/connected positions and disengaged/disconnected positions in one or more of a variety of ways, such as mechanically (e.g., via a lever/slider/cable, manually, etc.) and/or electronically (e.g., via an electric actuator/motor). The one or more latches/anchors 40 and/or the one or more electrical contacts 42 may restrict insertion/removal of a component 24 when in engaged/connected positions, and/or may not restrict insertion/removal of a component 24 when in disengaged/disconnected positions.

With embodiments, an electrical system 20 may include a system controller 50 (e.g., an electronic controller) that may be configured to monitor and/or control at least one component 24. The system controller 50 may be connected (e.g., fixed), at least indirectly, to the mounting surface 22 (e.g., with intermediate elements such that relative movement between the system controller 50 and the mounting surface 22 may be substantially prevented), and/or may move with the mounting surface 22 if the mounting surface 22 moves. The system controller 50 may be configured for wired and/or wireless communication. A system controller 50 may, for example, include an electronic processor 50a, a memory 50b, and/or a communication device 50c (e.g., a receiver, a transmitter, a transceiver, etc.) that may be configured for wireless and/or wired communication.

In embodiments, a component 24 may include and/or be connected to a respective component electrical unit 60 (e.g., component electrical units 60₁, 60₂, 60₃). A component electrical unit 60 may include one or more of a variety of configurations. For example and without limitation, a component electrical unit 60 may include and/or be connected to one or more controllers 62, sensors (e.g., sensor 74), receivers, transmitters, antennas, and/or actuators 68 (e.g., electric motors), among other things (see, e.g., FIGS. 3-6). A component controller 62 (e.g., an electronic controller) may, for example, include an electronic processor 62a, a memory 62b, and/or a communication device 62c (e.g., a receiver, a transmitter, a transceiver, etc.) that may be configured for wireless and/or wired communication (see, e.g., FIG. 1).

With embodiments, it may be desirable to determine the orientation of one or more components 24 relative to the mounting surface 22. For example and without limitation, with components 24 that include vehicle seats, it may be desirable to determine the orientation of a vehicle seat to properly deploy safety devices 64 (e.g., airbags, seat belt reminders, etc.). Some systems may determine a position (e.g., X and Y coordinates) of a seat relative to a mounting surface, but may not determine an orientation of the seat. Embodiments of an electrical system 20 may be configured to determine an orientation of a component 24 (e.g. in addition to determining a position of the component 24). The orientation of a component 24 may include, for instance, directed/facing forward, directed/facing rearward, disposed at an angle (e.g., in an X-Y plane) relative to the mounting surface 22, such as an oblique or right angle relative to an X-direction of the mounting surface 22 if the component 24 is not facing forward or rearward. An electrical system 20 may include a position sensor 66 that may obtain/determine a position of a component 24 and an orientation sensor/detection system 70 that may obtain/determine an orientation of the component 24. The position sensor 66 and the orientation sensor 70 may include one or more common elements. A position sensor 66 may include one or more of a variety of configurations. For example and without limitation, a position sensor 66 may include a camera (e.g., one or more of a variety of image and/or video capture devices), transmitters/receivers (e.g., antennas for received signal strength, angle-of arrival, and/or time of flight determinations), and/or a track sensor configured to detect track features corresponding to a position of the component along the track (e.g., formations, text, colors, magnets, etc.), among others.

Figure 3:
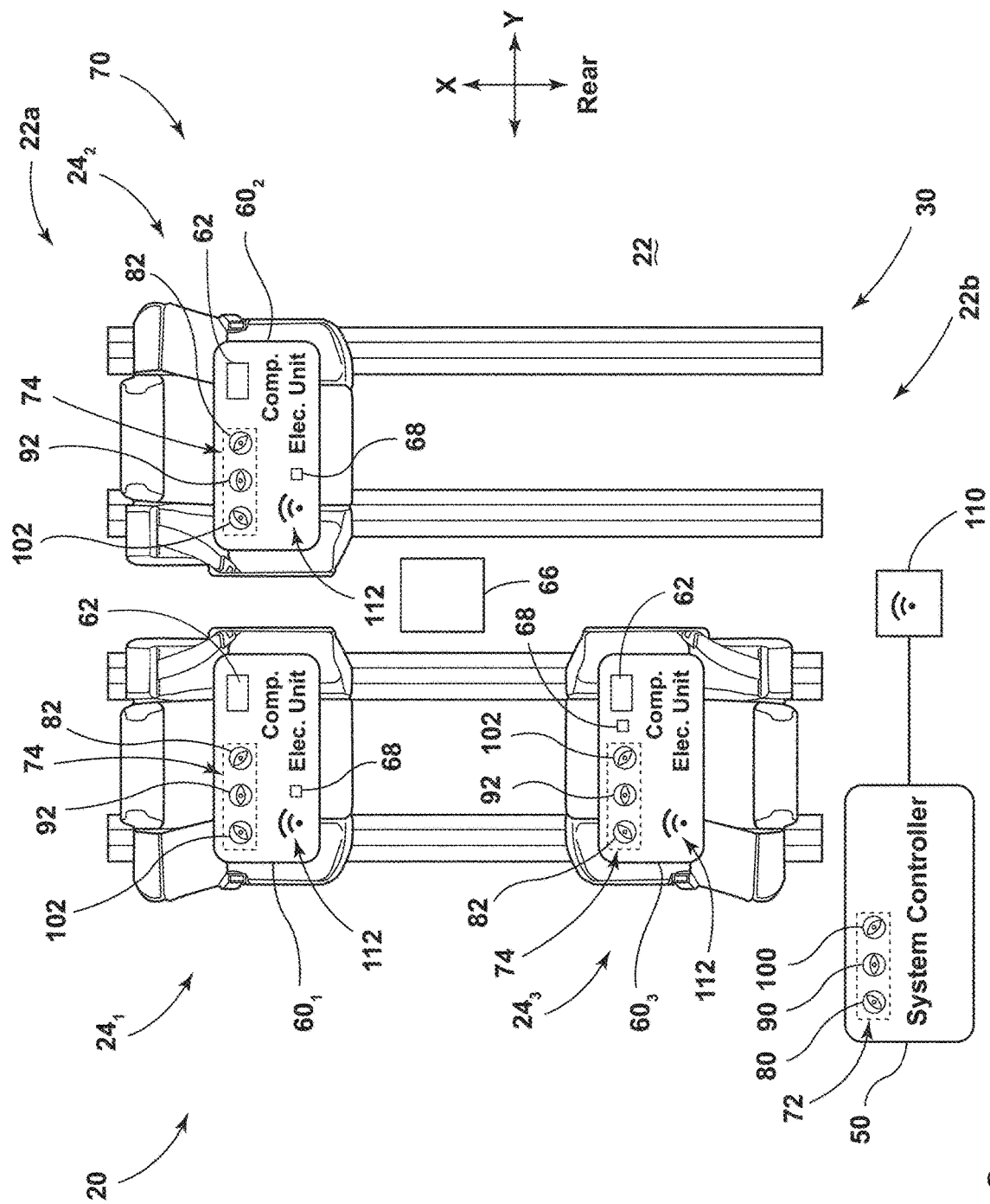
FIG. 3 is a top view generally illustrating an embodiment of an electrical system according to teachings of the present disclosure.

In embodiments, an orientation sensor 70 may include one or more of a variety of configurations. For example and without limitation, as generally illustrated in FIG. 3, an orientation sensor 70 may include a first sensor 72 and/or one or more second sensors 74 that may each be associated with (e.g., connected to move with) a respective component 24. The first sensor 72 may include a first magnetometer 80, and/or one or more second sensors 74 may include a respective second magnetometer 82. The first magnetometer 80 may be connected (e.g., fixed), at least indirectly, to the mounting surface 22 and/or may be configured to be disposed in a fixed manner relative to the mounting surface 22. The first magnetometer 80 may, for example and without limitation, be configured to provide information regarding the orientation of the mounting surface 22 (e.g., of a vehicle 26), such as relative to the magnetic poles of the earth. A second magnetometer 82 may be connected to and/or configured to move with a respective component 24. A second magnetometer 82 may, for example and without limitation, be configured to provide information regarding the orientation of the respective component 24, such as relative to the magnetic poles of the earth. A first magnetometer 80 and/or a second magnetometer 82 may, for example and without limitation, be configured as a compass, such as a solid-state compass.

With examples, a system controller 50 and/or a component controller 62 (either or both of which may include, be incorporated with, and/or be connected with the orientation sensor 70) may be configured to receive and/or compare first information (e.g., a magnetic field value, an angle, etc.) from the first magnetometer 80 and second information (e.g., a magnetic field value, an angle, etc.) from the one or more second magnetometers 82, such as via wired communication and/or via wireless communication (e.g., radio frequency (RF) communication). If the second information from a second magnetometer 82 is within a threshold range of the first information from the first magnetometer 80, the system controller 50 and/or a component controller 62 may be configured to determine that the component 24 associated with the second magnetometer 82 is oriented toward the front 22a of the mounting surface 22. For example and without limitation, if the absolute values of orientation angles determined from the first information and the second information are within a threshold range of angles, the system controller 50 and/or a component controller 62 may determine that the component 24 is oriented toward the front 22a of the mounting surface 22. If the second information from a second magnetometer 82 is not within the threshold range, the system controller 50 and/or a component controller 62 may be configured to determine that the component 24 is not oriented toward the front 22a of the mounting surface 22 and/or that the component 24 is oriented toward a rear 22b of the mounting surface 22. Additionally or alternatively, the system controller 50 and/or a component controller 62 may use the first information from the first magnetometer 80 and second information from a second magnetometer 82 to determine an orientation angle of the component 24 relative to the front 22a of the mounting surface 22, such as an angle between forward and rearward. The orientation angle may, in some circumstances, be an oblique or right angle relative to a longitudinal/X-direction of the mounting surface 22.

With examples, in addition to or instead of a magnetometer 80, 82, a first sensor 72 and/or a second sensor 74 may include one or more accelerometers 90, 92. For example and without limitation, the first sensor 72 may include a first accelerometer 90 that may be connected to the system controller 50 and/or substantially fixed relative to the mounting surface 22. Additionally or alternatively, the second sensor 74 of a component 24 may include a second accelerometer 92. Upon movement of the mounting surface 22 (e.g., movement of a vehicle 26), the system controller 50 and/or a component controller 62 may be configured to compare first information and second information (e.g., magnitude, direction, etc.) from the first accelerometer 90 and the second accelerometer 92, respectively. If second information from a second accelerometer 92 is within a threshold of first information from the first accelerometer 90, the system controller 50 and/or a component controller 62 may determine that the component 24 is facing a first direction relative to mounting surface 22 (e.g., toward the front 22a of the mounting surface 22). If the second information from the second accelerometer 92 is not within the threshold, the system controller 50 may determine that the component 24 is facing a second direction (e.g., toward a rear 22b of the mounting surface 22). Additionally or alternatively, the system controller 50 and/or a component controller 62 may determine an orientation angle, which may include an angle between the front 22a of the mounting surface 22 and a current orientation/direction of the component 24. If the first information and the second information include/correspond to similar magnitudes but opposite directions, the system controller 50 and/or a component controller 62 may, for example, determine that the component 24 is facing the second direction.

With examples, in addition to or instead of a magnetometer 80, 82 and/or an accelerometer 90, 92, a first sensor 72 and/or a second sensor 74 of an orientation sensor 70 may include one or more gyroscopes 100, 102. For example and without limitation, a first gyroscope 100 of a first sensor 72 may be connected to the system controller 50 and/or substantially fixed relative to the mounting surface 22. A respective second gyroscope 102 may be connected to and/or incorporated with each component 24 and/or a second sensor 74 thereof. Upon movement of the mounting surface 22 (e.g., movement of a vehicle 26), the system controller 50 and/or a component controller 62 may be configured to compare first information and second information (e.g., angular velocity) from the first gyroscope 100 and the second gyroscope 102, respectively. If second information from a second gyroscope 102 is within a threshold of first information from the first gyroscope 100, the system controller 50 and/or a component controller 62 may determine that the component 24 is facing a first direction relative to the mounting surface 22 (e.g., forward). If the second information from the second gyroscope 102 is not within the threshold, the system controller 50 and/or a component controller 62 may determine that the component 24 is facing a second direction (e.g., rearward).

In embodiments, a first sensor 72, a second sensor 74, a magnetometer 80, 82, an accelerometer 90, 92, and/or a gyroscope 100, 102 may be function as an environmental sensor (e.g., may sense information about an environment of a component 24) and/or may be referred to herein an environmental sensor. A first sensor 72 and/or a second sensor 74 may, for example and without limitation, include a gravity sensor, a global positioning system (GPS) sensor, and/or a radiation (e.g., space, light, etc.) sensor.

Figure 4A:
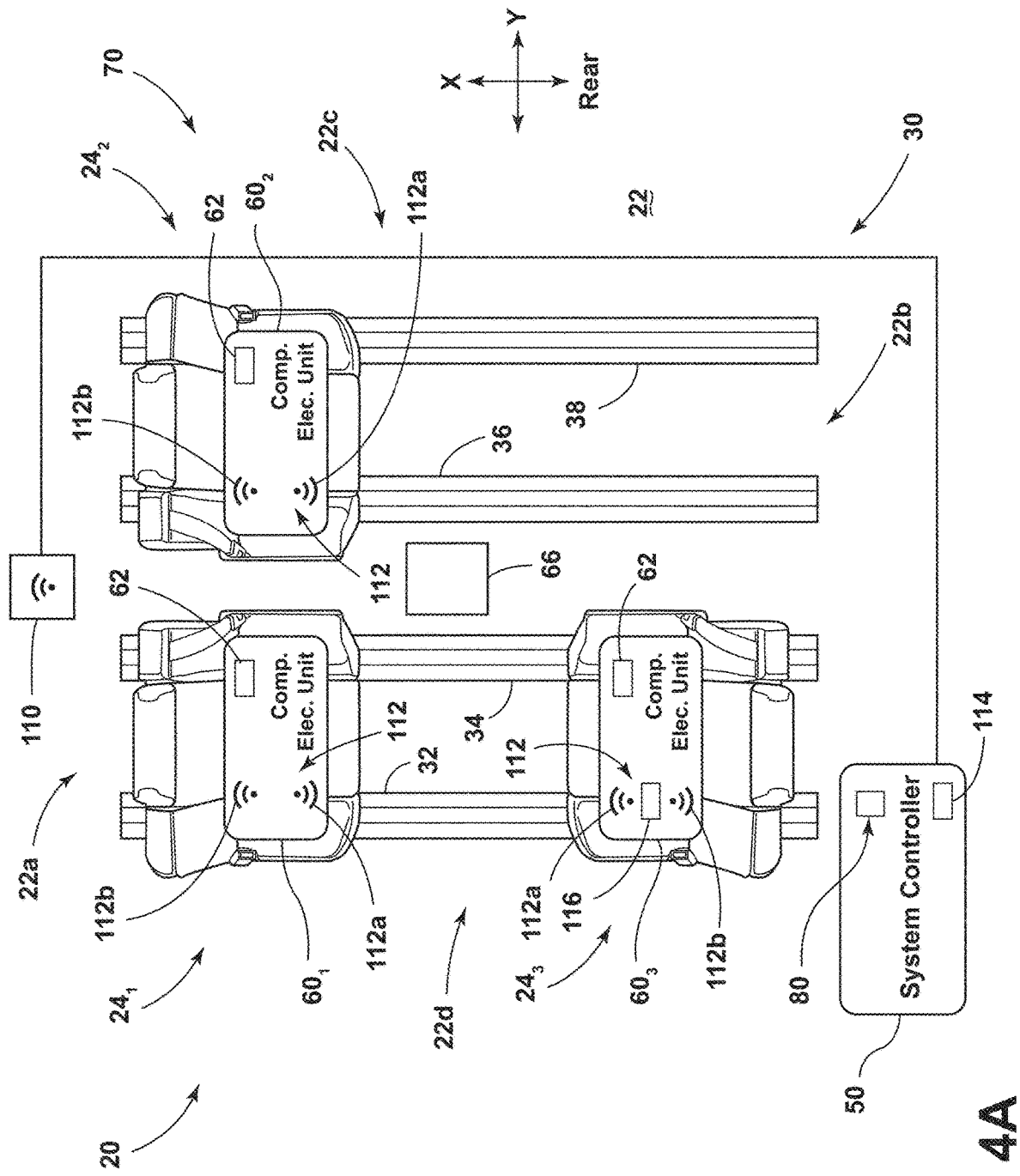
FIGS. 4A, 4B, and 4C are top views generally illustrating embodiments of electrical systems according to teachings of the present disclosure.
Figure 4B:
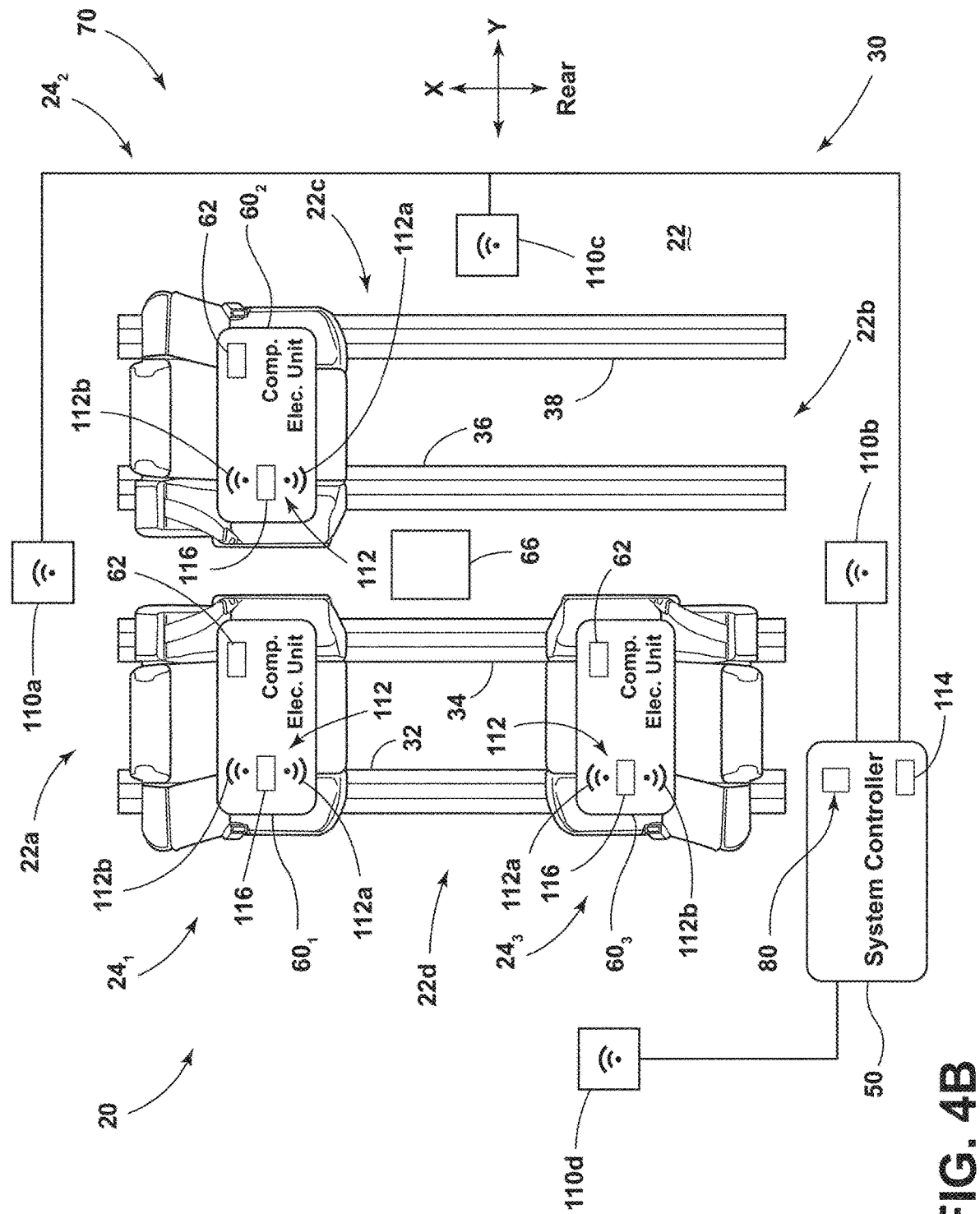
Figure 4C:
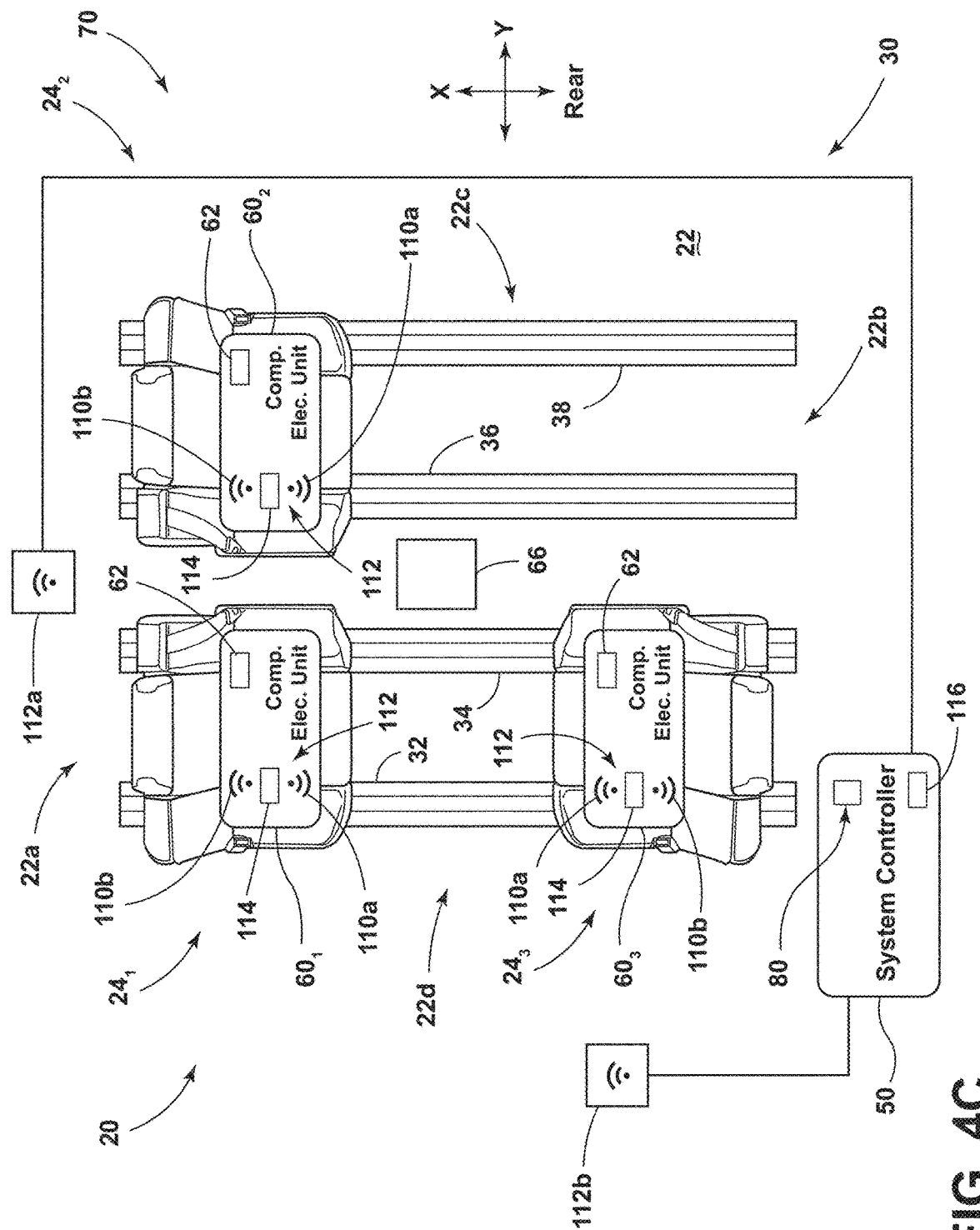

In examples, such as generally illustrated in FIGS. 4A, 4B, and 4C, an orientation sensor 70 may include one or more transmitters (e.g., antennas) 110 and/or one or more receivers 112 (e.g., antennas) that may be configured to receive signals from the one or more transmitters 110. A system controller 50 and/or a component controller 62 may utilize a combination of at least three transmitters and receivers (e.g., one transmitter and two receivers, two transmitters once receiver, two or more transmitters and two or more receivers, etc.) to obtain an orientation of a component 24. With some configurations, the one or more transmitters 110 may be configured to be fixed relative to the mounting surface 22, and the one or more receivers 112 may be fixed relative to the component 24. In other configurations, the one or more transmitters 110 may be configured to be fixed relative to the component 24 and the one or more receivers 112 may be fixed relative to the mounting surface 22 (or a combination thereof). A system controller 50 and/or a component controller 62 may be configured to control operation of and/or to use information from a pair of transmitters 110 and/or a pair of receivers 112, such as to define a vector that may correspond to the orientation of the component 24.

With embodiments, such as generally illustrated in FIG. 4A, a transmitter 110 may be connected (e.g., fixed), at least indirectly, to the mounting surface 22 and/or may be fixed relative to the mounting surface 22. A respective pair of receivers 112a, 112b may be included with and/or connected to some or each of the one or more components 24 (and/or a component controller 62 thereof). A system controller 50 and/or a component controller 62 may control operation of the one or more transmitters 110. The system controller 50 and/or the component controller 62 may be configured to receive information from the pair of receivers (e.g., a first/front receiver 112a and a second/rear receiver 112b) to determine an orientation of the component 24. For example and without limitation, the pair of receivers 112a, 112b may be offset in a direction relevant to and/or according to a position of a transmitter 110. A direction relevant to the transmitter 110 may, for example and without limitation, include an X-direction if the transmitter 110 is disposed proximate the front 22a or rear 22b of the mounting surface 22, and/or may include a Y-direction if the transmitter 110 is disposed proximate a side 22c, 22d of the mounting surface 22. The system controller 50 and/or the component controller 62 may determine that the receiver 112a, 112b that receives the stronger version of a signal transmitted by a transmitter 110 is closer to that transmitter 110. For example, if the front receiver 112a receives the stronger signal, the system controller 50 and/or the component controller 62 may determine that the component 24 is facing forward if the transmitter 110 is disposed at or about the front 22a of the mounting surface 22, and vice versa.

In embodiments, such as generally illustrated in FIG. 4B, an electrical system 20 may include a plurality of transmitters 110, such as a front transmitter 110a, a rear transmitter 110b, a right transmitter 110c, and/or a left transmitter 110d, that may be disposed in a fixed manner relative to the mounting surface 22 (e.g., may move with and may not move relative to the mounting surface 22). With such a configuration having a plurality of transmitters 110 associated with the mounting surface 22, a single receiver (e.g., receiver 112a) may be associated with each component 24 or a plurality of receivers (e.g., receivers 112a, 112b) may be associated with each component 24. The single receiver 112a or the plurality of receivers 112a, 112b may be offset from a center of the component 24, such as in a direction substantially perpendicular to an adjustment direction (e.g., may be offset in a Y-direction if an X-direction is an adjustment direction). For example, a system controller 50 and/or a component controller 62 may control the plurality of transmitters 110 such that each transmitter 110 provides a different signal to be received by the single receiver 112a. A system controller 50 and/or a component controller 62 may determine that the component 24 is oriented toward the transmitter 110 that transmits the signal that is received strongest by the single receiver 112a (e.g., after compensating for the position of the component 24, such as determined via a position sensor 66). Additionally or alternatively, a system controller 50 and/or a component controller 62 may utilize a first transmitter (e.g., transmitter 110a) to determine/obtain a position of the component 24 and may utilize one or more additional transmitters (e.g., transmitters 110c, 110d), which may be offset from the first transmitter 110a in a plurality of directions (e.g., an X-direction and a Y-direction), to determine/obtain an orientation of the component 24. For example, a system controller 50 and/or a component controller 62 may utilize the position of the component 24 to obtain/determine a distance of the component 24 from the one or more additional transmitters 110c, 110d, and then utilize that distance and the signal strength from the one or more additional transmitters 110c, 110d to determine the orientation of the component 24 (e.g., via a lookup table). If a second receiver 112b is connected or included with the component 24, a system controller 50 and/or a component controller 62 may determine that the component 24 is facing the transmitter 110 that transmits the signal that is received strongest by both receivers 112a, 112b and/or may utilize the signal that is received strongest by either receiver 112a, 112b (e.g., and may ignore the other signal and/or receiver).

In embodiments, such as generally illustrated in FIG. 4C, one or more receivers 112 of an electrical system 20 may be disposed in a fixed manner relative to the mounting surface 22, and/or one or more transmitters 110 may be connected to respective components 24. For example, a first receiver 112a may be disposed proximate a front 22a of the mounting surface 22, a second receiver 112b may be disposed proximate a rear 22b of the mounting surface 22, a single transmitter 110a may be connected with each component 24, and/or a system controller 50 and/or a component controller 62 may determine that the component 24 is oriented toward the receiver 112a, 112b that receives the strongest signal from the single transmitter 110a (e.g., after compensating for the position of the component 24, such as determined via a position sensor 66). Additionally or alternatively, a system controller 50 and/or a component controller 62 may determine the orientation via a single transmitter 110a in a similar manner described above in connection with a component 24 having a single receiver 112a. For example, a system controller 50 and/or a component controller 62 may utilize a first receiver 112a to determine a position of the component 24 and/or a distance of the component 24 from the second receiver 112b, and may use the distance and the signal strength at the second receiver 112b to determine the orientation of the component 24 (e.g., via a lookup table). The first receiver 112a and the second receiver 112b may be offset in a plurality of directions (e.g., an X-direction and a Y-direction). For example, the first receiver 112a may be disposed at a front 22a or rear 22b of the mounting surface 22, and/or the second receiver 112b may be disposed proximate an outer side of the mounting surface 22, such as at or about half way between the front 22a and the rear 22b.

In another embodiment, a single receiver 112a may be disposed in a fixed manner relative to the mounting surface 22 and each component 24 may include a respective pair of transmitters 110a, 110b that may transmit signals that may be at least slightly different (e.g., frequency, amplitude, etc.) and may be offset in a direction relevant to the receiver 112a (e.g., an X-direction if the receiver 112a is disposed proximate a front 22a of the mounting surface 22). A system controller 50 and/or a component controller 62 may determine that the front 24a of the component 24 is facing the receiver 112a if the signal from the first transmitter 110a is stronger than the signal from the second transmitter 110b, and/or may determine that the rear 24b of the component 24 is facing the receiver 112a if the signal from the second transmitter 110b is stronger than the signal from the first transmitter 110a.

With embodiments, an orientation sensor 70 may include a plurality of transmitters 110, such as for configurations in which components 24 may be connected to the mounting surface 22 in a large area. The transmitters 110 may be configured to transmit signals to respective areas of the mounting surface 22 and the areas may overlap. The signals transmitted by the transmitters 110 may be different (e.g., different frequency, amplitude, etc.). The transmitters 110 may, for instance, be disposed at or about opposite ends 22a, 22b and/or opposite sides 22c, 22d of the mounting surface 22, and/or may be disposed in an array about the mounting surface 22.

In embodiments, an orientation sensor 70 (e.g., the receivers 112), a system controller 50, and/or a component controller 62 may be configured to determine an angle of arrival and/or a time of flight corresponding to a signal or signals received by the one or more receivers 112 to determine the orientation of the component 24. For example and without limitation, the orientation sensor 70 may be configured to operate as a time-of-flight (ToF) sensor and/or an angle of arrival sensor. An angle of arrival (AoA) determination may include determining an orientation angle of the component 24 (e.g. in an X-Y plane), which may include an angle of 0 degrees or 180 degrees, an oblique angle, and/or a right angle.

With embodiments, a transmitter 110 and/or a receiver 112 may include and/or be configured as an antenna, such as a single-dimensional antenna and/or a multi-dimensional (e.g., 3-D) antenna. In embodiments with a plurality of transmitters (e.g., transmitters 110a, 110b, 110c, 110d), each transmitter may include and/or be configured as a respective antenna, some or all of which may be connected to a common transmitter unit/chip 114 that may be included with and/or connected to a system controller 50 or a component controller 62 (see, e.g., FIGS. 4B and 4C). For example and without limitation, if a plurality of transmitters 110a, 110b, 110c, 110d are fixed relative to the mounting surface 22, each of the transmitters 110a, 110b, 110c, 110d may include a respective antenna that may be connected to a common transmitter unit/chip 114 connected to and/or included with the system controller 50 (see, e.g., FIGS. 4A and 4B).

In embodiments with a plurality of receivers (e.g., receivers 112a, 112b), each receiver may include and/or be configured as a respective antenna, some or all of which may be connected to a common receiver unit/chip 116 that may be included with and/or connected to a system controller 50 and/or a component controller 62 (see, e.g., FIGS. 4A-4C). For example and without limitation, if a component 24 includes a plurality of receivers 112*a*, 112*b*, the receivers 112*a*, 112*b* may each include and/or be configured as an antenna that may be connected to a common receiver unit/chip 116 connected to and/or included with the component controller 62 of the component 24 (see, e.g., FIGS. 4A and 4B).

With embodiments, a transmitter 110 and/or a receiver 112 may be configured to transmit and receive (e.g., may be configured as a transceiver).

Figure 5:
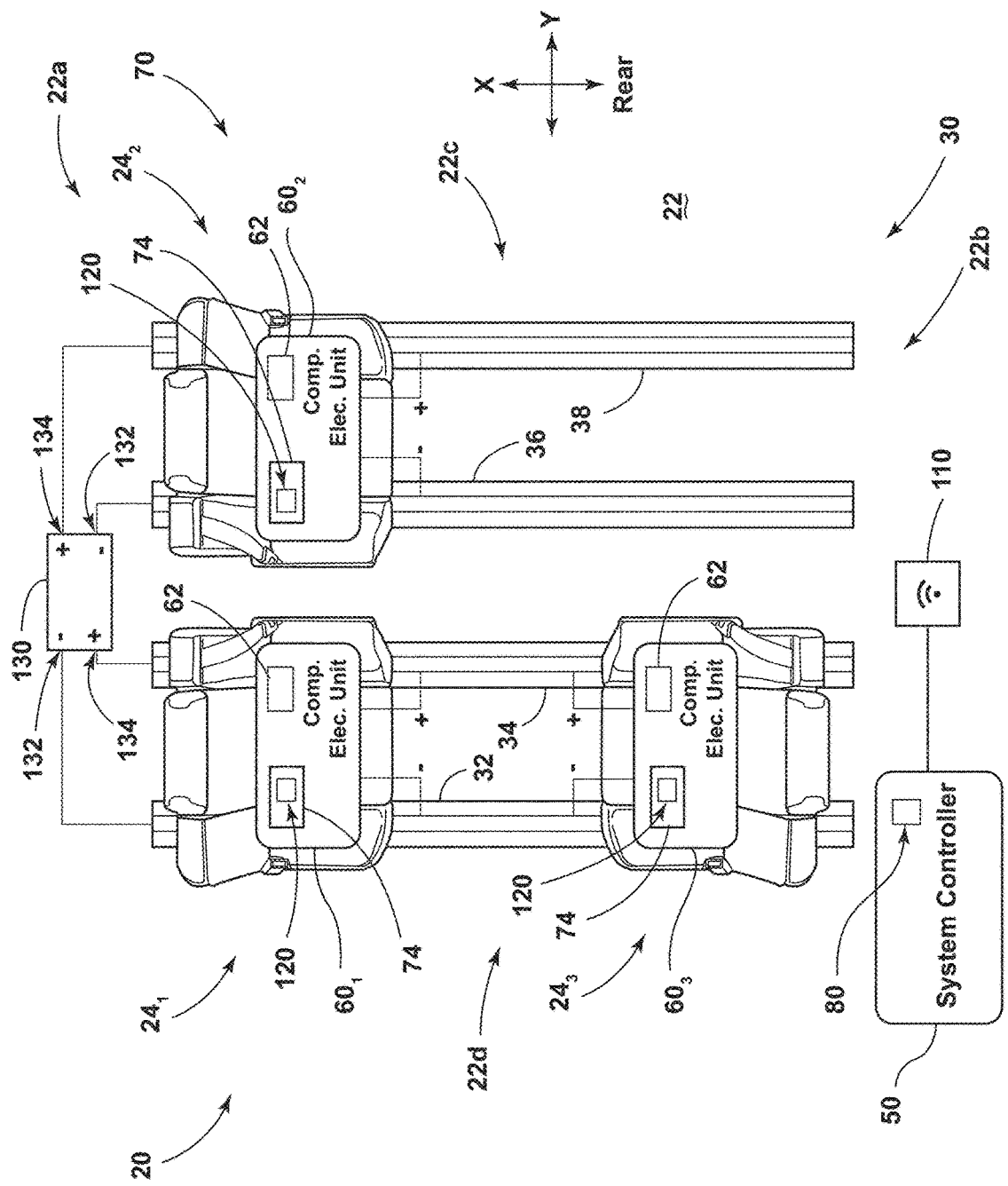
FIG. 5 is a top view generally illustrating an embodiment of an electrical system according to teachings of the present disclosure.

In embodiments, such as generally illustrated in FIG. 5, an orientation sensor 70 may include one or more electrical characteristic sensors 120 (e.g., a voltage sensor, a current sensor, a resistance sensor, a polarity sensor, etc.) that may be included with and/or connected to a component 24 (and/or a component controller 62 thereof). A track assembly 30 may be configured to provide electrical power to the one or more components 24. For example and without limitation, the first track 32 and the third track 36 may be connected to a negative terminal 132 of a power source 130 and the second track 34 and the fourth track 38 may be connected to a positive terminal 134 of the power source 130. When the power source 130 is on/active, an electrical characteristic sensor 120 may determine which direction current is flowing. If current is flowing in a first direction, the system controller 50, the component controller 62, the orientation sensor 70, and/or the electrical characteristic sensor 120 may determine that the component 24 is facing a first direction (e.g., forward) and if current is flowing in a second direction, the system controller 50, the component controller 62, the orientation sensor 70, and/or electrical characteristic sensor 120 may determine that the component 24 is facing a second direction (e.g., the opposite direction or rearward). The electrical characteristic sensor 120, the orientation sensor 70, and/or the component controller 62 may be configured to communicate the determined orientation to the system controller 50.

Additionally or alternatively, in embodiments, a system controller 50 may be configured to provide (e.g., via the power source 130) different voltages and/or currents to tracks 32, 34, 36, 38 of a track assembly 30. For example and without limitation, the system controller 50 may provide a first voltage of about 12 V to a first track 32 and/or a second voltage of about 12.5 V to a second track 34. If the electrical characteristic sensor 120 senses/detects the first voltage, the system controller 50, the component controller 62, the orientation sensor 70, and/or the electrical characteristic sensor 120 may determine that the component 24 has a first orientation (e.g., is facing forward/toward the front 22*a*). If the electrical characteristic sensor 120 senses/detects the second voltage, the system controller 50, the component controller 62, the orientation sensor 70, and/or the electrical characteristic sensor 120 may determine that the component 24 has a second orientation (e.g., is facing rearward/toward the rear 22*b*).

Figure 6:
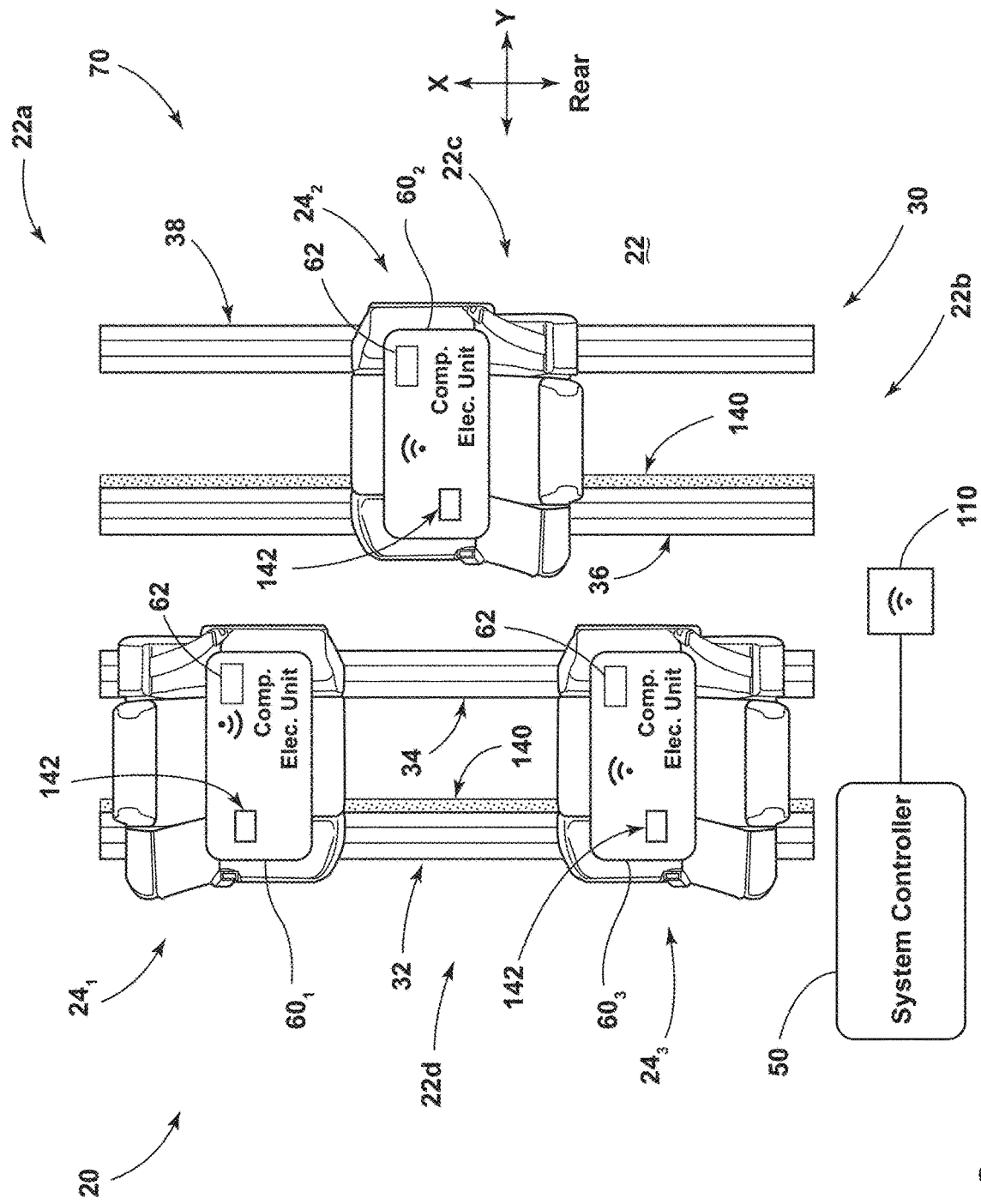
FIG. 6 is a top view generally illustrating an embodiment of an electrical system according to teachings of the present disclosure.

With examples, such as generally illustrated in FIG. 6, an orientation sensor 70 may include an orientation feature 140 that may be connected to and/or incorporated with the track assembly 30 and/or may include an orientation feature sensor 142 that may be configured to sense the orientation feature 140. An orientation feature 140 may include one or more of a variety of shapes, sizes, configurations, and/or materials. For example and without limitation, an orientation feature 140 may include a metal or magnetic portion of one track (e.g., track 32 or track 36) of a pair of tracks that the other track (e.g., track 34 or track 38) of the pair of tracks does not include. The orientation feature sensor 142 may be configured to sense the presence of the metal or magnetic portion (e.g., may be configured as a Hall sensor). If the orientation feature sensor 142 senses the orientation feature 140, the orientation sensor 70, the system controller 50, and/or a component controller 62 may determine that the component 24 is facing a first direction (e.g., forward). If the orientation feature sensor 142 does not sense the orientation feature 140, the orientation sensor 70, the system controller 50, and/or a component controller 62 may determine that the component 24 is facing a second direction (e.g., rearward or an angle between forward/rearward).

Additionally or alternatively, an orientation feature 140 may include a portion of a track (e.g., tracks 32, 36) of a pair of tracks that includes a particular color (e.g., black, white, green, red, etc.). The other track (e.g., tracks 34, 38) of the pair of tracks may include a different color or no color. The orientation feature sensor 142 may be configured to sense the color or lack of color (e.g., may be configured as an infrared (IR) sensor). The orientation sensor 70, the component controller 62, and/or the system controller 50 may determine the orientation of the component 24 according to information from the orientation feature sensor 142.

With embodiments, an orientation feature 140 may include one or a combination of (i) a formation (e.g., cut, dent, roughness, flange, recess, void etc.) of a track/rail (e.g., tracks/rails, 32, 36) configured to be sensed by the orientation feature sensor 142, (ii) a magnet or magnetic portion of a track/rail configured to be sensed by the orientation feature sensor 142, (iii) a portion of a track/rail having a color configured to be sensed by the orientation feature sensor 142, (iv) a mounting angle (e.g., one or more portions of a track 32, 36 may be disposed at different angle than the other track 34, 38), (v) one or more portions of a track 32, 36 having a different material (e.g., plastic, wood, metal) than the other track 34, 38, (vi) a track providing a different sound, and/or (vii) a track providing a different radiation (e.g., light).

Figure 7:
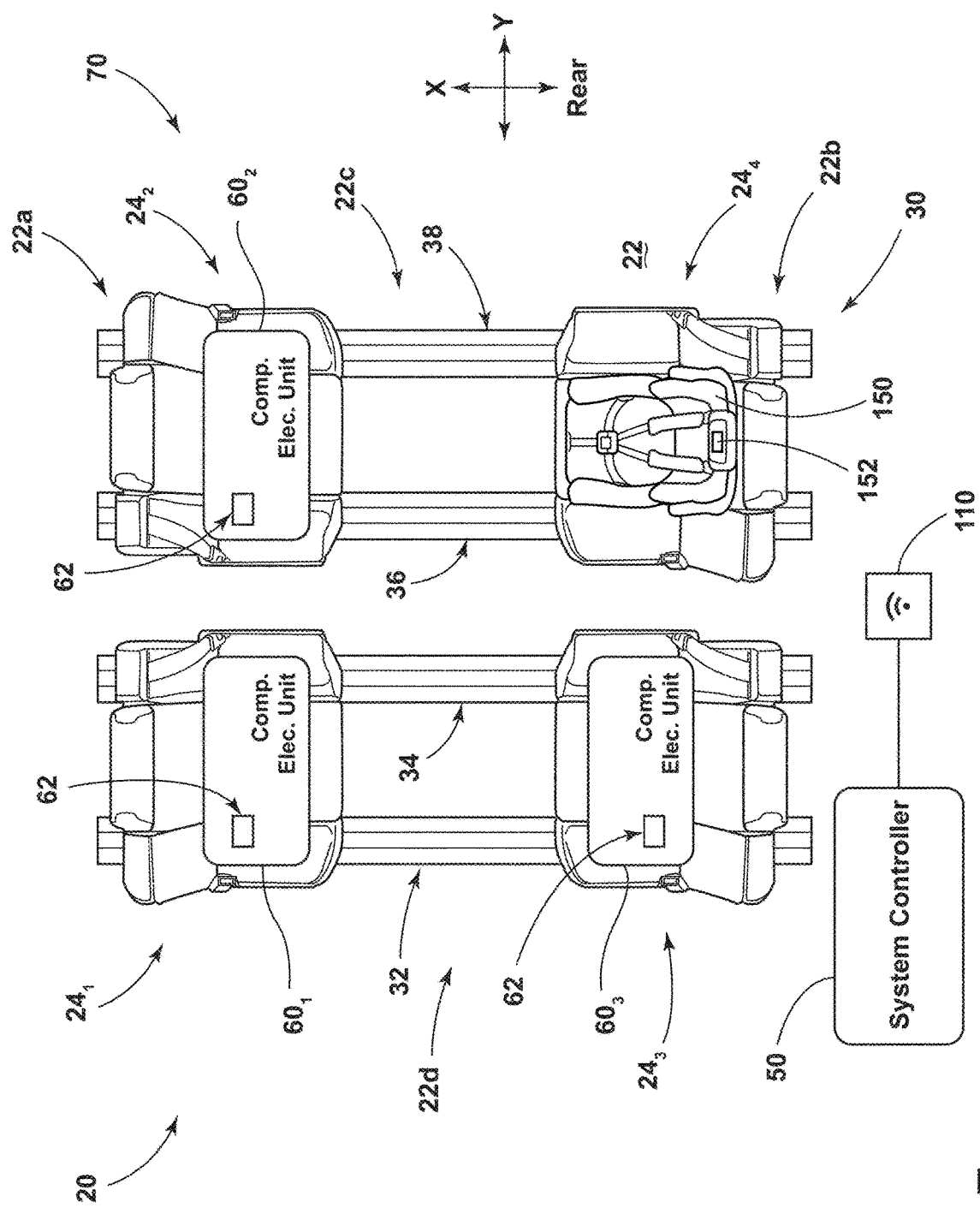
FIG. 7 is a top view generally illustrating an embodiment of an electrical system according to teachings of the present disclosure.

In embodiments, such as generally illustrated in FIG. 7, an orientation sensor 70 may include a child seat sensor 150 that may be configured to detect the orientation of a child seat 152 that may be fixed to and/or move with a component 24 (e.g., a fourth component 244). The child seat sensor 150 may be connected to the mounting surface 22, the component 24, and/or the child seat 152. A child seat sensor 150 may, for example and without limitation, include a camera (e.g., one or more of a variety of image and/or video capture devices), a transmitter, and/or a receiver, among other things. Additionally or alternatively, a child seat sensor 150 may be configured in a similar manner as a first sensor 72 and/or a second sensor 74. For example and without limitation, a child seat sensor 150 may include one or more magnetometers, accelerometers, gyroscopes, transmitters, receivers, and/or electrical characteristic sensors.

With embodiments, a system controller 50 and/or a component controller 62 may be configured to control one or more safety devices 64 (see, e.g., FIG. 2) that may be connected to a component 24 and/or a mounting surface 22 (e.g., a vehicle 26), such as according to a determined orientation of the component 24 (e.g., activate the safety devices 64 differently depending on the determined orientation). For example and without limitation, in the event of a crash of a vehicle 26, a system controller 50 and/or a component controller 62 may activate a first safety device 64*a* if the component 24 is in the first orientation, and/or may activate a second safety device 64*b* and/or a third safety device 64c if the component 24 is in the second orientation. Additionally or alternatively, the system controller 50 and/or a component controller 62 may activate a plurality of safety devices 64 differently by activating the plurality of safety devices 64 in a different order depending on the determined orientation of the component 24. In embodiments, if an electrical system 20 includes a child seat sensor 150, a system controller 50 and/or a component controller 62 may be configured to control one or more safety devices 64 according to the orientation of the component 24 and/or the orientation of a child seat 152.

Figure 8:
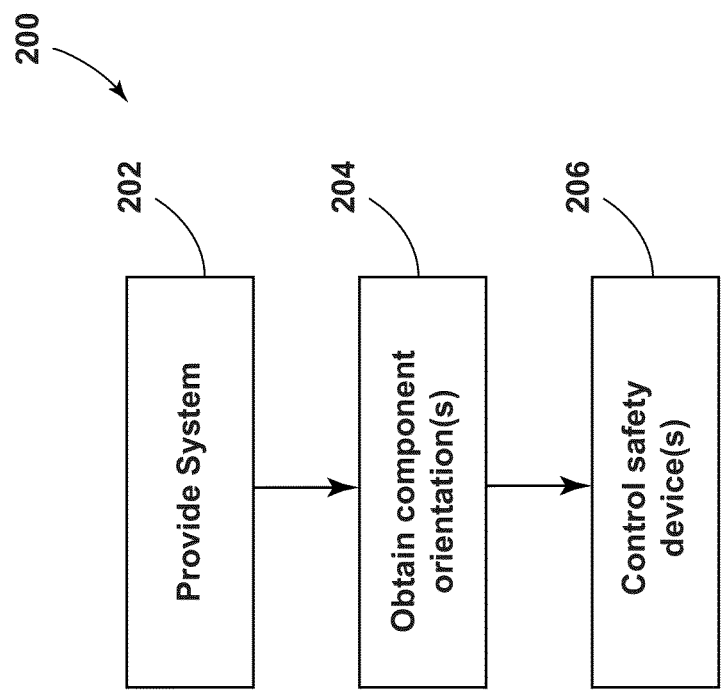
FIG. 8 is a flow chart generally illustrating an embodiment of a method of operating an electrical system according to teachings of the present disclosure.

With embodiments, such as generally illustrated in FIG. 8, a method 200 of operating an electrical system 20 may include providing an electrical system 20 (block 202), determining an orientation of one or more components 24 (block 204), and/or controlling (e.g., activating or not) one or more safety devices 64 according to the determined orientation(s) (block 206). Determining an orientation of one or more components 24 may include obtaining first information relating to a mounting surface 22 (e.g., a vehicle), obtaining second information relating to the component 24, and/or comparing the first information with the second information. If the second information is within a threshold of the first information, a system controller 50 and/or a component controller 62 may determine that the component 24 is facing a front 22a of the mounting surface 22. If the second information is not within a threshold of the first information, a system controller 50 and/or a component controller 62 may determine that the component 24 is facing a different direction, is directed at an angle (e.g., an oblique angle or a right angle) relative to a longitudinal direction of the component 24, and/or is facing a rear 22b of the mounting surface 22 (e.g., if the second information is substantially opposite the first information).

In embodiments, a system controller 50, a component controller 62, and/or an orientation sensor 70 may be configured to communicate with each other, such as to share information relating to the orientation of a component 24, to determine the orientation of a component 24, and/or to share a determined/obtained orientation of a component 24.

While some exemplary embodiments are shown in the drawings for illustrative purposes with a track/rail assembly 30, embodiments of the current disclosure are not limited to configurations with track/rail assemblies 30. While some exemplary embodiments of track assemblies 30 are shown in the drawings for illustrative purposes as extending in an X-direction, embodiments of electrical systems 20 may include tracks that extend in other directions (e.g., the Y-direction, the Z-direction, etc.), extend at other angles, and/or that include a matrix-type configuration that may allow for a wide range of movement.

In embodiments, one or more actions/determinations described herein as conducted via the system controller 50 may additionally or alternatively be conducted, in whole or in part, via one or more component electrical units 60 and/or component controllers 62 thereof (and vice versa). The system controller 50 may, for example and without limitation, be configured to control movement of the mounting surface 22 and/or of an associated vehicle 26.

In examples, a controller (e.g., a system controller 50, a controller 62 of the component electrical unit 60, etc.) may include an electronic controller and/or include an electronic processor, such as a programmable microprocessor and/or microcontroller. In embodiments, a controller may include, for example, an application specific integrated circuit (ASIC). A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the use of examples/embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a controller (e.g., the system controller 50, a component controller 62 of a component electrical unit 60, etc.), a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical system, comprising:
a component configured for selective connection with, movement relative to, and removal from a mounting surface;
an orientation sensor configured to determine an orientation of the component relative to said mounting surface, the orientation sensor including a first sensor configured for at least indirect connection to said mounting surface, and a second sensor configured to move with the component;
a system controller configured to be disposed in a fixed manner relative to said mounting surface; and
a component electrical unit including an electronic component controller connected to or incorporated with the component;
wherein one or a combination of the system controller, the electronic component controller, and the orientation sensor is configured to compare first information from the first sensor to second information from the second sensor to determine the orientation of the component relative to the mounting surface.

2. The electrical system of claim 1, wherein the first sensor includes a first magnetometer configured to provide the first information;
the first magnetometer is configured to be disposed in a fixed manner relative to said mounting surface;
the second sensor includes a second magnetometer configured to provide the second information; and
the second magnetometer is connected to move with the component.

3. The electrical system of claim 2, wherein comparing the first information and the second information includes determining if the second information is within a threshold range of the first information.

4. The electrical system of claim 3, wherein determining the orientation of the component includes determining that the component is oriented toward a front of said mounting surface if the second information is within the threshold range of the first information.

5. The electrical system of claim 2, wherein determining the orientation of the component includes determining an orientation angle of the component; and
the orientation angle is an oblique angle or a right angle relative to a longitudinal direction of said mounting surface.

6. The electrical system of claim 1, including a plurality of safety devices proximate the component;
wherein at least one of the system controller and the component electrical unit are configured to activate the plurality of safety devices differently depending on the determined orientation of the component.

7. The electrical system of claim 1, wherein the second sensor includes a first transmitter and a second transmitter configured to move with the component relative to said mounting surface;
the first sensor includes a receiver configured to be disposed in a fixed manner relative to said mounting surface; and
the first transmitter and the second transmitter are offset in a direction according to a position of the receiver.

8. The electrical system of claim 1, including an electronic controller;
wherein the orientation sensor includes a voltage sensor and/or current sensor connected to the component; and
the electronic controller is configured to determine the orientation of the component according to information from the voltage sensor and/or current sensor.

9. The electrical system of claim 1, including a track assembly configured for connection to said mounting surface, the track assembly including a first track and a second track offset from the first track;
wherein the component is configured for selective connection with, movement relative to, and removal from the track assembly.

10. The electrical system of claim 1, wherein at least one of the first sensor and the second sensor includes an environmental sensor.

11. The electrical system of claim 10, wherein the environmental sensor includes one or a combination of a magnetometer, an accelerometer, and a gyroscope.

12. The electrical system of claim 1, wherein the orientation sensor is configured to determine an orientation of a child seat connected to move with the component.

13. An electrical system, comprising:
a component configured for selective connection with, movement relative to, and removal from a mounting surface; and
an orientation sensor configured to determine an orientation of the component relative to said mounting surface;
wherein the orientation sensor includes:
(i) a transmitter configured to be disposed in a fixed manner relative to said mounting surface; a first component receiver and a second component receiver configured to move with the component relative to said mounting surface; wherein the second component receiver is offset from the first component receiver in a direction according to a position of the transmitter; or
(ii) a receiver configured to be disposed in a fixed manner relative to said mounting surface; and a first component transmitter and a second component transmitter configured to move with the component relative to said mounting surface; wherein the first component transmitter and the second component transmitter are offset in a direction according to a position of the receiver.

14. The electrical system of claim 13, including an electronic controller configured to:
(i) control operation of the transmitter and to receive information from the first component receiver and the second component receiver to determine the orientation of the component; or
(ii) receive, via the receiver, information from the first component transmitter and the second component transmitter to determine the orientation of the component.

15. The electrical system of claim 14, wherein determining the orientation of the component includes an angle of arrival determination and/or a time-of-flight determination.

16. An electrical system, comprising:
a component configured for selective connection with, movement relative to, and removal from a mounting surface;
an orientation sensor configured to determine an orientation of the component relative to said mounting surface; and
a track assembly configured for connection to said mounting surface, the track assembly including a first track and a second track offset from the first track;
wherein the first track includes an orientation feature and the orientation sensor includes an orientation feature sensor configured to sense the orientation feature; and
the component is configured for selective connection with, movement relative to, and removal from the track assembly.

17. The electrical system of claim 16, wherein the orientation sensor includes a first sensor connected, at least indirectly, to the mounting surface, and a second sensor connected to move with the component.

18. The electrical system of claim 17, including a system controller configured to be disposed in a fixed manner relative to said mounting surface; and
a component electrical unit including an electronic component controller connected to or incorporated with the component;
wherein one or a combination of the system controller, the electronic component controller, and the orientation sensor is configured to compare first information from the first sensor to second information from the second sensor to determine the orientation of the component relative to the mounting surface.

19. The electrical system of claim 16, wherein the orientation feature includes one or a combination of (i) a formation configured to be sensed by the orientation sensor, (ii) a magnet configured to be sensed by the orientation sensor, (iii) a portion having a color configured to be sensed by the orientation sensor, (iv) a mounting angle, and (v) a different material than the second track.

20. An electrical system, comprising:
a component configured for selective connection with, movement relative to, and removal from a mounting surface;
an orientation sensor configured to determine an orientation of the component relative to said mounting surface;
a track assembly configured for connection to said mounting surface, the track assembly including a first track and a second track offset from the first track; and
a system controller configured to be disposed in a fixed manner relative to said mounting surface;
wherein the system controller is configured to provide, via a power source, a first voltage to the first track and a second voltage to the second track;
the component is configured for selective connection with, movement relative to, and removal from the track assembly;
the orientation of the component is toward a front of said mounting surface if the orientation sensor detects the first voltage; and
the orientation of the component is toward a rear of said mounting surface if the orientation sensor detects the second voltage.

* * * * *